United States Patent [19]

Mohd

[11] Patent Number: 5,841,206
[45] Date of Patent: Nov. 24, 1998

[54] METHODS FOR WIRING ELECTRICAL SYSTEMS AND ELECTRICAL SYSTEMS WIRED TO REDUCE NOISE

[75] Inventor: Bassam J. Mohd, Sunnyvale, Calif.

[73] Assignee: Sun Microsystems, Inc., Palo Alto, Calif.

[21] Appl. No.: 759,779

[22] Filed: Dec. 3, 1996

[51] Int. Cl.$^6$ ...................................................... H01B 11/02
[52] U.S. Cl. .............................. 307/147; 174/36; 326/90; 370/257; 370/423; 395/287
[58] Field of Search ............................... 307/147; 174/36; 364/260; 326/90; 395/287; 370/257, 423, 151

[56] References Cited

U.S. PATENT DOCUMENTS

| | | | |
|---|---|---|---|
| 4,085,448 | 4/1978 | Kogge ...................................... | 395/287 |
| 4,349,870 | 9/1982 | Shaw et al. .............................. | 395/287 |
| 4,736,124 | 4/1988 | McFarland ................................ | 326/90 |
| 5,115,105 | 5/1992 | Gallusser et al. .......................... | 174/36 |

OTHER PUBLICATIONS

Howard L. Skolnik, "Noise and Wiring in Data Signal Handling", 1993 Process/Industrial Instruments & Control Handbook Fourth Edition, pp. 7.29–7.36 no month.

M. Zargham, S. Tragoudas and J. Seely, "Integrated Circuits", 1993 The Electrical Engineering Handbook, pp. 581–593. No month.

*Primary Examiner*—Richard T. Elms
*Assistant Examiner*—Albert W. Paladini
*Attorney, Agent, or Firm*—Beyer & Weaver, LLP

[57] ABSTRACT

The present invention teaches a variety of methods and apparatus. The steps of one method for wiring an electrical system having a first bus and a second bus are as follows. Routing a wire B between wires A and A' and a wire B' adjacent to wire A' within the first bus, the wire B intended to transmit a first signal, the wire B' intended to transmit a signal associated with the first signal, the wire A intended to transmit a second signal, and the wire A' intended to transmit a third signal associated with the second signal. Routing a wire D between wires C and C' and a wire D' adjacent to the wire C' within the second bus, the wire D intended to transmit a fourth signal, the wire D' intended to transmit a signal associated with the fourth signal, the wire C intended to transmit a fifth signal, and the wire C' intended to transmit a sixth signal associated with the fifth signal. Additionally, the first and second buses are arranged such that A is adjacent to C, B is adjacent to D, A' is adjacent to C', and B' is adjacent to D'. A separate embodiment of the present invention teaches an electrical device. A first bus includes a wire B routed between wires A and A' and a wire B' routed adjacent to wire A'. The wire B is intended to transmit a first signal, the wire B' is intended to transmit a signal associated with the first signal, the wire A is intended to transmit a second signal, and the wire A' is intended to transmit a third signal associated with the second signal. Similarly, a second bus includes a wire D routed between wires C and C' and a wire D' routed adjacent to C'. The wire D is intended to transmit a fourth signal, the wire D' is intended to transmit a signal associated with the fourth signal, the wire C is intended to transmit a fifth signal, and the wire C' is intended to transmit a sixth signal associated with the fifth signal. The second bus is disposed such that A is adjacent to C, B is adjacent to D, A' is adjacent to C', and B' is adjacent to D'.

25 Claims, 4 Drawing Sheets

METHODS FOR WIRING ELECTRICAL SYSTEMS AND ELECTRICAL SYSTEMS WIRED TO REDUCE NOISE

TECHNICAL FIELD

The present invention relates to the field of wire routing within electrical systems. More specifically, the present invention teaches electrical systems having wires routed to decrease noise due to capacitive cross coupling between neighboring wires, and methods for making the same. These methods are particularly useful when routing two or more parallel buses each having a plurality of wires.

BACKGROUND ART

In the field of electronics, meeting the demands of the market requires competitive manufacturers to continually improve their product. For most products, this translates into a push for devices which perform their functions faster, use less power, and fit into smaller footprints. Of course, there is no tolerance for errors. Unfortunately, these goals are rarely concordant, with gains in one area typically made at the expense of another.

An integrated circuit is a combination of circuit elements, such as arrays of transistors and other components, built from a single chip of semiconductor material. The circuit elements are inseparably associated within a semiconductor substrate, and, using well known techniques, are wired together and/or to external connections. Typically the wiring involves forming metallization layers over the substrate, etching the metallization layers appropriately, and then surrounding the patterned metallization layers with dielectric. By appropriately routing the wires, the circuit elements are interconnected to perform their desired functions.

Unfortunately, neighboring wires running substantially parallel to one another have an unintended and detrimental electrical coupling interaction. Of primary interest, for the present discussion, is the effect termed capacitive cross coupling. Capacitive cross coupling increases the effective wire capacitance thereby increasing signal propagation delay. One direct result of speed propagation delay is speed degradation of the integrated circuit. Furthermore, a signal transitioning on one wire excites the cross coupling capacitance potentially causing noise on a neighboring wire. Noise on a wire may result in circuit elements misfiring.

Only further aggravating the situation, improvement in the areas described above often increases the coupling between neighboring wires and/or makes the circuit more sensitive to the existing coupling effects. For example, the desire for faster circuitry requires components which respond faster. But, in general, the more responsive an electrical component is to its intended signal, the more sensitive the component is to noise. As another example, decreasing the size of an integrated circuit results in more wires in a smaller footprint, potentially causing greater coupling between the wires. As a final example, the drive to decrease power consumption results in lower powered signals. In turn, the signal to noise ratio decreases.

Another factor effecting the noise on wires is the transmission scheme used to control the signal sent on the wires. Two common digital transmission schemes are the "static" and "dynamic" transmission schemes. In both the static and dynamic transmission schemes, signals are transmitted via pairs of wires associated with one another.

As will be appreciated, in a static transmission scheme a pair of wires A and A' are intended for carrying complementary signals. That is, A carries a particular signal, and A' carries a complement of the particular signal. Thus when A is in a LOW logic state, A' will be in a HIGH logic state, and vice versa. In contrast, a dynamic transmission scheme utilizes a pair of wires A and A' as follows. When A is transitioning, say from a LOW logic state to a HIGH logic state, A' will be in a quiescent state. Similarly, when A' is transitioning, A will be in a quiescent state. A given wire in a quiescent state merely means that the signal on the given wire is not transitioning. Thus the signal on the given wire could be in a LOW logic state, a HIGH logic state, or perhaps even a floating state wherein the output driving the given wire has gone to a high impedance state and nothing else is driving the given wire. For the purposes of the following analysis, it is sufficient to treat a quiescent wire as connected to the ground reference.

With reference to FIG. 1, a circuit 100 illustrative in explaining the noise and other effects due to capacitive cross coupling will now be described. Circuit 100 includes invertors 102 and 104, a wire 106, and wires N1 and N2 running parallel to and neighboring the wire 106. The wire 106 interconnects the invertors 102 and 104 such that invertor 102 drives the invertor 104. An unintended capacitive coupling exists between wire 106 and neighboring wires N1 and N2. The unintended capacitive coupling can be effectively modeled as a capacitor C1 and a capacitor C2, capacitively coupling wire N1 to wire 106 and wire N2 to wire 106, respectively. In general, coupling capacitance between neighboring wires is a primary, or first order, source of cross coupling capacitance. In addition, capacitors Cd and Cg capacitively couple the wire 106 to a ground reference 108 as shown. But, since the inclusion of Cd and Cg does not substantively effect the outcome, Cd and Cg are ignored in the following analysis for the sake of simplicity.

FIG. 2 is a plot 120 illustrating noise 122 on the wire 106 of FIG. 1. The noise 122 is voltage plotted as a function of time. Thus noise energy is proportional to an area 124 under the noise curve. As will be appreciated, the noise energy on a wire, as opposed to an instantaneous voltage measurement, is the better parameter for evaluating the noise on the wire. In general, noise energy on a given wire is a function of a dynamic variable termed the cross coupling ratio $C_c$:

$$C_c = \frac{\text{cross capacitance between active lines and the given wire}}{\text{total cross coupling capacitance of the given wire}}$$

Decreasing a wire's cross coupling ratio decreases the noise energy thereby improving transmission characteristics across the wire. For a specific example illustrating how to calculate the cross coupling capacitance, assume that N1 is switching and N2 is quiescent. Ignoring the effects of Cd and Cg, in FIG. 1 N1 switching and N2 quiescent yields a cross coupling ratio of C1/(C1+C2) for the wire 106.

FIG. 3 illustrates a portion of an integrated circuit 150 having four distinct metallization layers M1, M2, M3, and M4. Each metallization layer has been formed into a bus, i.e., a set of wires used to connect a number of circuit elements and to transfer information. Typically, the wires within a given bus are substantially parallel with one another. The integrated circuit 150 has been wired according to a conventional technique such that pairs of associated wires are routed together. For example, within M4, the wire pair A and A' are routed adjacent to one another. Each metallization layer is wired in a similar manner with respect to wire pairs B and B', C and C', D and D', E and E', F and F', G and G', and H and H'.

FIG. 4 is a schematic 170 modeling the capacitive cross coupling effects on the wire C' of integrated circuit 150 by its neighboring wires. For the sake of simplicity, in the integrated circuit 150 shown in FIG. 3, wire pairs from M1 and M2 are assumed to run perpendicular to wire pairs from M3 and M4 and, thus, have no capacitive coupling effect on M3 and M4. Basic circuit analysis yields a total cross coupling capacitance along the wire C' of C1+C2+C3+C4+ C5.

By way of example, one "worst case" noise scenario will now be evaluated. Assuming a dynamic transmission scheme, the worst case scenario for the capacitive cross coupling to the center wire C' is when each possible neighboring wire with the largest coupling capacitance is transitioning in the same direction. As will be appreciated by one skilled in the art, such a worse case implies that A', B, C and D are switching in the same direction and A is quiescent. The worst case yields a capacitive cross coupling ratio of:

$$C_c = \frac{C1 + C3 + C4 + C5}{C1 + C2 + C3 + C4 + C5}$$

Shielding wires is one common technique for reducing the capacitive coupling between a given wire and its neighboring wires. Shielding two wires from each other merely involves running a grounded wire between the two.

FIG. 5, of the prior art, illustrates a schematic 180 modeling a shielding of the wire C' of the integrated circuit 150 from its neighboring wire C. As in FIG. 4, basic circuit analysis yields a total cross coupling capacitance along the wire C' of C1+C2+C3+C4+C5. However, assuming the worst case described above with reference to FIG. 4 yields a capacitive cross coupling ratio of:

$$C_c = \frac{C3 + C4 + C5}{C1 + C2 + C3 + C4 + C5}$$

Hence running a grounded shield wire between the two wires C' and C eliminates the capacitive cross coupling C1 between the wires. The result is improved transmission speed and a decrease in noise energy. However, the improvements that shielding provides are not free. Completely shielding each of the wires of the integrated circuit 150 requires inserting a grounded shield wire in between every signal carrying wire. Assuming signal wires and ground wires are of the same width, this would result in a utilization of only 50% of the available area, resulting in a corresponding decrease in the wiring density of the integrated circuit.

What is needed is a method for routing wires which decreases the effects of capacitive cross coupling yet does not so drastically decrease the wiring density of the electrical system being wired.

DISCLOSURE OF THE INVENTION

In accordance with the present invention, a variety of methods and apparatus are disclosed. A first aspect of the present invention teaches a method for wiring an electrical system having a first bus and a second bus. Within the first bus, the method requires routing a wire B between wires A and A', the wire B intended to transmit a first signal, the wire A intended to transmit a second signal, the wire A' intended to transmit a third signal associated with the second signal. Within the second bus, the method requires routing a wire D between wires C and C', the wire D intended to transmit a fourth signal, the wire C intended to transmit a fifth signal, and the wire C' intended to transmit a sixth signal associated with the fifth signal. Additionally, the method teaches arranging the first and second buses such that A is adjacent to C, B is adjacent to D, and A' is adjacent to C'.

Related aspects further teach that the signals intended to be transmitted along the wires A, A', B, C, C', and D, may be transmitted according to either a static or a dynamic transmission scheme. However, any suitable transmission scheme may be used depending upon the particular application.

A separate embodiment of the present invention teaches an electrical device having a first bus and a second bus. The first bus includes a wire B routed between wires A and A'. The wire B is intended to transmit a first signal, the wire A is intended to transmit a second signal, and the wire A' is intended to transmit a third signal associated with the second signal. Similarly, the second bus includes a wire D routed between wires C and C'. The wire D is intended to transmit a fourth signal, the wire C is intended to transmit a fifth signal, and the wire C' is intended to transmit a sixth signal associated with the fifth signal. In addition, the second bus is disposed such that A is adjacent to C, B is adjacent to D, and A' is adjacent to C'.

The present invention also teaches an electrical device having a first bus including a first plurality of pairs of associated wires and a second bus including a second plurality of pairs of associated wires. Within the first bus, an isolating wire is routed between a first two sets of two pairs from the first plurality of pairs, each wire in the first two sets routed alternately such that wires from pairs are not adjacent one to another. Similarly, within the second bus, a second isolating wire is routed between a second two sets of two pairs from the second plurality of pairs, each wire in the second two sets routed alternately such that wires from pairs are not adjacent one to another.

BRIEF DESCRIPTION OF THE DRAWINGS

The invention, together with further objectives and advantages thereof, may best be understood by reference to the following description taken in conjunction with the accompanying drawings which are described below.

BEST MODES FOR CARRYING OUT THE INVENTION

The teachings of the present invention may be best understood when viewed in light of a more precise definition of the capacitive cross coupling ratio. A more precise definition of the capacitive cross coupling ratio provides:

$$C_c = \frac{\text{cross coupling capacitance between lines switching in the same direction and the given wire}}{\text{total cross coupling capacitance of the given wire}}$$

Figure 6:
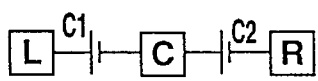
FIG. 6 is an electrical schematic useful for illustrating in more detail the nature of the capacitive cross coupling ratio.

A circuit 190 of FIG. 6 will now be described in order to provide insight into the ramifications of this more precise definition of the capacitive cross coupling ratio. The circuit 190 has a center wire C that is neighbored on the left by a wire L and on the right by a wire R. The wire C is capacitively cross coupled with the wires L and R via capacitance C1 and C2, respectively. Thus, the total cross coupling capacitance of the wire C is C1+C2. Now, when the signal on the wire L is switching from LOW to HIGH and the signal on the wire R is quiescent, the cross coupling ratio is $C_c = C2/(C2+C2)$. However, when the signal on the wire L is switching from LOW to HIGH and the signal on the wire R is switching from HIGH to LOW, then $C_c=0$. Thus the cross coupling ratio is dependent upon the directions in which the noisy neighboring wires are switching.

Figure 7:
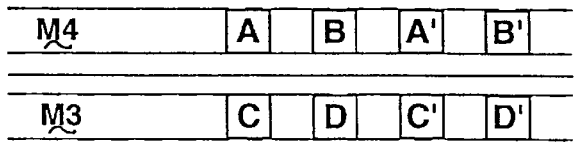
FIG. 7 is a pictorial illustration of an integrated circuit wired according to one aspect of the present invention.

FIG. 7 illustrates a wiring pattern in accordance with a first embodiment of the present invention. An integrated circuit 200 includes metallization layers M3 and M4 running parallel to each other. Each of the metallization layers M3 and M4 form a bus having at least two pairs of wires, the metallization layer M3 having the pairs C–C' and D–D' and the metallization layer M4 having the pairs A–A' and B–B'. The metallization layers M3 and M4 may each further include additional wires running parallel with one another and with wires in the other bus.

The nature of the signals across the wires depends, in part, upon the utilized transmission scheme. For example, when a static transmission scheme is used, the wire A is intended to carry a first signal and the wire A' is intended to carry a complement of the first signal. Similarly, under the static transmission scheme, the wire B is intended to carry a second signal and the wire B' is intended to carry a complement of the second signal. Further, in some embodiments of the present invention different transmission schemes may be used within the same bus.

Figure 8:
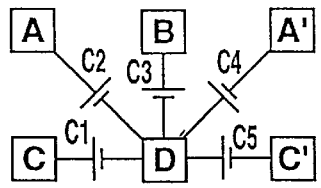
FIG. 8 is an electrical schematic modeling the capacitive cross coupling effects of the integrated circuit of FIG. 7.

FIG. 8 illustrates an electrical schematic 220 modeling the cross coupling effects of the integrated circuit 200. The wire pairs are arranged within the integrated circuit such that, where ever realizable, a wire is neighbored by associated wires. Thus, when a signal is transmitted via a static transmission scheme across a complementary pair such as A and A', the resultant noise effect on both the wires B and D is null, since A and A' effectively cancel each other out. Thus, within a static transmission scheme, the worst case cross coupling ratio's numerator is only a single cross coupling capacitor, with no loss of wiring area. Evaluating the particular example of the wire D yields a capacitive cross coupling ratio of:

$$C_c = \frac{C3}{C1 + C2 + C3 + C4 + C5}$$

The noise cancellation effects between wire pairs such as A and A' found in a static transmission scheme are not the same in a dynamic transmission scheme. However, the wiring strategies of the present invention do provide advantages in a dynamic transmission scheme also. Assume, in FIG. 8, that the signals across wires A, B, and C are transitioning to an identical logic state, either HIGH or LOW. (This is a worst case scenario for a wire routed according to the present invention.) In a dynamic transmission scheme, this implies A', B', and C' are quiescent. Thus the cross coupling ratio is:

$$C_c = \frac{C1 + C2 + C3}{C1 + C2 + C3 + C4 + C5}$$

Figure 1:
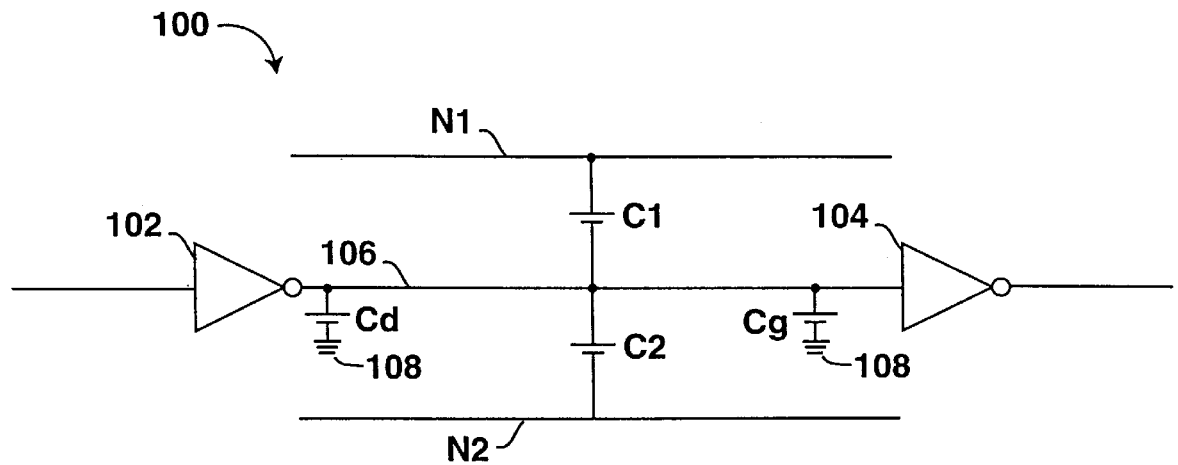
FIG. 1 is an electrical schematic showing a circuit illustrative of the capacitive cross coupling effects between neighboring wires.
Figure 2:
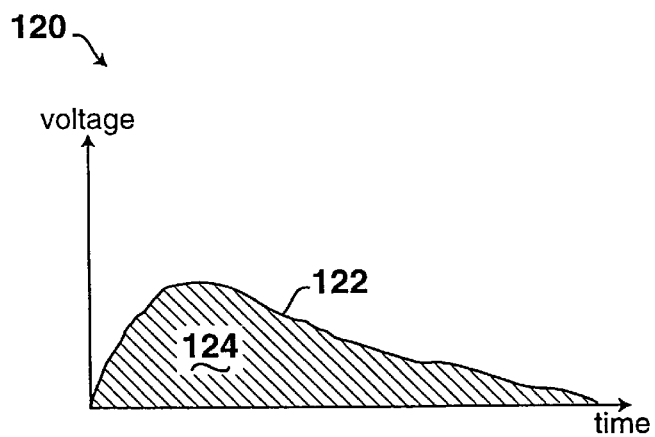
FIG. 2 is diagram plotting a noise curve of the circuit of FIG. 1.
Figure 3:
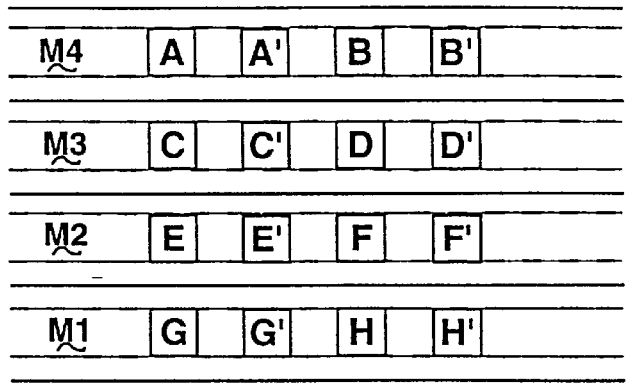
FIG. 3, of the prior art, is a pictorial illustration of an integrated circuit wired via a number of metallization layers.
Figure 4:
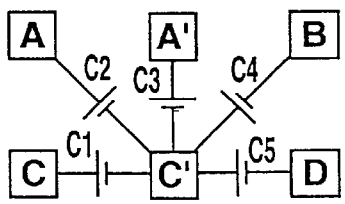
FIG. 4, of the prior art, is an electrical schematic modeling the capacitive cross coupling effects within the integrated circuit of FIG. 3.
Figure 5:
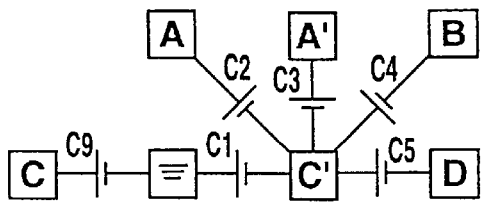
FIG. 5, of the prior art, is an electrical schematic modeling the capacitive cross coupling effects within the integrated circuit of FIG. 3 after a grounded shield wire has been run within a metallization layer.

Comparing the prior art worst case example described above with the worst case scenario of the present invention indicates a 20% reduction in noise over the prior art of FIG. 4. Furthermore, the embodiment of FIG. 8 is provided with no sacrifice of wiring area utilization. As described below with reference to FIG. 9, the wiring methods described with reference to FIGS. 7 and 8 are particularly well suited for use in routing buses having a multiplicity of electrical wires.

Figure 9:
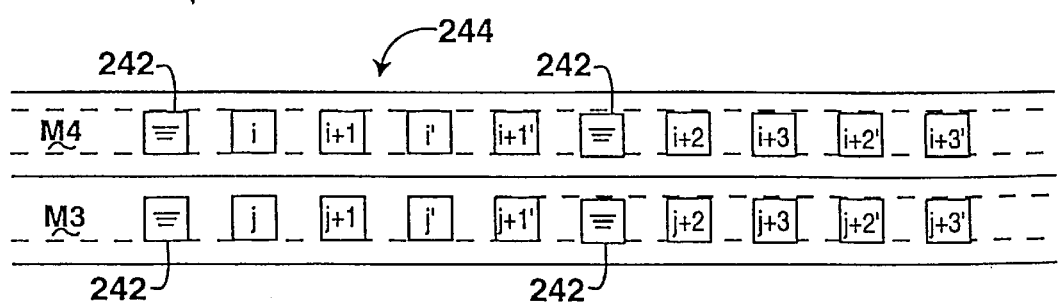
FIG. 9 is a pictorial illustration of an integrated circuit wired according to another aspect of the present invention.

An integrated circuit 240 having a plurality of wires arranged into two buses and designed in accordance with one aspect of the present invention will now be described with reference to FIG. 9. The integrated circuit 240 includes a metallization layer M4 formed into a first bus having a multiplicity of wire pairs such as i and i', i+1 and i+1', i+2 and i+2', i+3 and i+3', and so on. The integrated circuit 240 also includes a metallization layer M3 formed into a second bus having a multiplicity of wire pairs j and j', j+1 and j+1', j+2 and j+2', j+3 and j+3', j+4 and j+4', and so on. Each of these pairs is related according to either the static or the dynamic transmission schemes described above.

Within a given bus (either metallization layer M3 or M4), pairs are arranged into sets of two pairs such as a set 244 having i, i+1, i', and i+1', each set being electrically isolated from adjacent sets by an isolating wire. The isolating wire is most typically a grounded shield wire 242. However, the purpose of the isolating wire is prevention of capacitive cross coupling between adjacent sets of wire pairs. Accordingly, the isolating wire may be utilized for transmitting any signal which would maintain the isolating characteristic of the isolating wire. For example, the insulating wire could carry a DC power signal. As another example, the isolating wire could carry a signal known ahead of time to not interfere with its neighboring wires, perhaps due to the timing of the signal switching.

For each set of wire pairs 244, the pairs are arranged with their members alternating, similar to the integrated circuit 200 of FIG. 7. In other words, a portion of the wires shown in FIG. 9 can be thought of as being mapped from the electrical schematic 220 shown in FIG. 8. This mapping would work by using the wire D as the "origin," which could be mapped to either wire j+1 or j' shown in FIG. 9. The other wires would map accordingly. For example, mapping D to j+1 results in corresponding mappings of C to j, A to i, B to i+1, A' to i', and C' to j'.

As with the embodiment described above with reference to FIGS. 6 and 7, the embodiment of FIG. 8 subjects a given wire to noise due to capacitive cross coupling from at most one or three neighboring wires, depending upon whether a static or dynamic transmission scheme is used. The cost of the noise reduction is one ground per four signal wires. In other words, a 20% reduction in area utilization. This contrasts markedly with the 50% reduction in area utilization found in the prior art shielding method described in the background.

Figure 10:
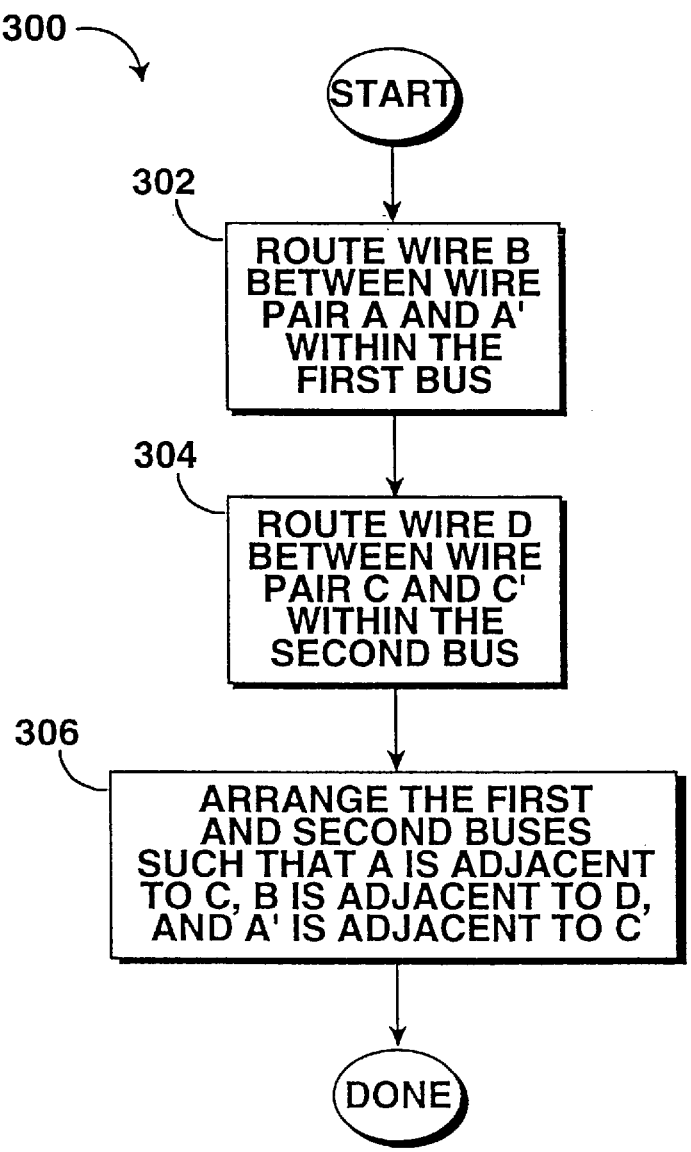
FIG. 10 is a flow chart illustrating a method for wiring according to yet another aspect of the present invention.

FIG. 10 illustrates a flow chart for performing a method 300 in accordance with one aspect of the present invention. In a step 302, a wire B is routed between a pair of associated wires A and A'. Each of the wires A, A', and B are disposed within a first bus. Then, in a step 304, a wire D is routed between a pair of associated wires C and C'. Next, in a step 306, the first and second buses are arranged, with respect to one another, such that the wire A is adjacent to the wire C, the wire B is adjacent to the wire D, and the wire A' is adjacent to the wire C'.

The method 300 may be performed during the wiring process of an integrated circuit such as integrated circuit 200 of FIG. 7. In such a case, the buses may be formed utilizing well known processes such as metal deposition, and masking and etching. As will be appreciated, the steps 302, 304, and 306 are not necessarily temporal limitations upon the method but, rather, present a strategy for planning the wire routing performed by the metal deposition and subsequent patterning.

Although only a few embodiments of the present invention have been described, it should be understood that the present invention may be embodied in many other specific forms without departing from the spirit or scope of the invention.

The embodiments described above operated under the assumption that the buses formed from the metallization layers M3 and M4 were substantially parallel. While this reflects the situation wherein separate buses would have the greatest capacitive coupling effect upon one another, it is not the only situation in which the application of the present invention is useful. For example, the buses might run in parallel for only a portion of their lengths. In such a case, the wiring methods of the present invention still provide an effective way for decreasing the coupling effect between buses with a relatively small loss in area utilization.

Furthermore, the strategies described above are well suited for wiring three or more metallization layers and have similar advantages. In order to perform such a wiring, the methods described with respect to FIGS. 7 and 9 need merely be applied to additional layers.

Still further, the described methods of the present invention are well suited for wiring most electrical devices, not just integrated circuit type electrical devices. For example, the described methods are well suited for use in wiring interconnects upon a printed circuit board. In general, the methods of the present invention are suitable for any electrical device or other application using sets of wires having associated pairs of wires, such as A and A'.

Therefore, the present examples are to be considered as illustrative and not restrictive, and the invention is not to be limited to the details given herein, but may be modified within the scope of the appended claims.

I claim:

1. A method for wiring an electrical system having a first bus and a second bus, the method comprising the acts of:
   routing a wire A and a wire A' within the first bus:
   routing a wire B between wires A and A' within the first bus to reduce noise on wire B, the wire B intended to transmit a first signal, the wire A intended to transmit a second signal, the wire A' intended to transmit a third signal associated with the second signal;
   routing a wire C and a wire C' within the second bus:
   routing a wire D between wires C and C' within the second bus to reduce noise on wire D, the wire D intended to transmit a fourth signal, the wire C intended to transmit a fifth signal, and the wire C' intended to transmit a sixth signal associated with the fifth signal;
   arranging the first and second buses such that A is adjacent to C, B is adjacent to D, and A' is adjacent to C'; and
   arranging the first bus to be substantially parallel with the second bus along a portion of a length of the second bus.

2. A method for wiring an electrical system as recited in claim 1 including the act of arranging the first bus and the second bus to run parallel with one another for substantially the entire length of the second bus.

3. A method for wiring an electrical system as recited in claim 1 including the act of arranging the first bus to run parallel with the second bus along a portion of a length of the second bus.

4. A method for wiring an electrical system as recited in claim 1 wherein the second and third signals are associated such that the second and third signals are complements of each other.

5. A method for wiring an electrical system as recited in claim 1 wherein the second and third signals are associated such that when the second signal is transitioning, the third signal is quiescent.

6. A method as recited in claim 1 further including the acts of:
   within the first bus, routing a wire B' adjacent to A' such that noise on wire A' is reduced, the wire B' intended to transmit a seventh signal associated with the first signal; and
   within the second bus, routing a wire D' adjacent to C' such that noise on wire C' is reduced, the wire D' intended to transmit an eighth signal associated with the third signal.

7. A method as recited in claim 6 further including the acts of:
   routing a first isolating wire adjacent to the wire B' within the first bus; and
   routing a second isolating wire adjacent to the wire D' within the second bus.

8. A method as recited in claim 7 wherein the first isolating wire is connected to a ground.

9. A method as recited in claim 7 wherein the first isolating wire is connected to a direct current power source.

10. A method as recited in claim 1 wherein the electrical system is an integrated circuit including a plurality of electronic devices embedded in a substrate, and the first bus and second bus are made from first and second metallization layers formed over the substrate.

11. An electrical device comprising:
   a first bus including a wire B routed between wires A and A' to control noise on wire B, the wire B intended to transmit a first signal, the wire A intended to transmit a second signal, the wire A' intended to transmit a third signal associated with the second signal;
   a second bus including a wire D routed between wires C and C' to control noise on wire D, the wire D intended to transmit a fourth signal, the wire C intended to transmit a fifth signal, and the wire C' intended to transmit a sixth signal associated with the fifth signal to control noise induced on wire D, the second bus disposed such that A is adjacent to C, B is adjacent to D, and A' is adjacent to C', wherein the first bus is arranged to run substantially parallel with the second bus along a portion of the second bus.

12. An electrical device as recited in claim 11 wherein the first bus is arranged to run substantially parallel along an entire length of the second bus.

13. An electrical device as recited in claim 11 wherein the second and the third signals are associated such that the second and third signals are complements of each other.

14. An electrical device as recited in claim 11 wherein the second and third signals are associated such that when the second signal is transitioning, the third signal is quiescent.

15. An electrical device as recited in claim 11 wherein the first bus further includes a wire B' routed adjacent to A' to control noise induced on wire A', the wire B' intended to transmit a seventh signal associated with the first signal, and the second bus further includes a wire D' routed adjacent to C', the wire D' intended to transmit an eighth signal associated with the third signal to control noise induced on wire C'.

16. An electrical device as recited in claim 15 wherein the first bus further includes a first isolating wire routed adjacent to the wire B', and the second bus further includes a second isolating wire routed adjacent to the wire D'.

17. An electrical device as recited in claim 15 wherein the first isolating wire is electrically coupled to a ground.

18. An electrical device as recited in claim 15 wherein the first isolating wire is electrically coupled to a direct current power source.

19. An electrical device as recited in claim 11 wherein the electrical device is an integrated circuit having a plurality of electronic components embedded in a substrate, and the first bus and second bus are made from first and second metallization layers formed over the substrate.

20. An integrated circuit (IC) device comprising:
a first bus including a first plurality of pairs of associated wires and a first isolating wire, the first bus arranged such that the first isolating wire is routed between a first two sets of two pairs from the first plurality of pairs, each wire in the first two sets routed alternately such that wires from pairs are not adjacent one to another to control noise in the first plurality of pairs of associated wires; and a second bus including a second plurality of pairs of associated wires and a second isolating wire, the second bus arranged such that the second isolating wire is routed between a second two sets of two pairs from the second plurality of pairs, each wire in the second two sets routed alternately such that wires from pairs are not adjacent one to another to control noise in the second plurality of pairs of associated wires, wherein the first bus is arranged to run substantially parallel with the second bus along a portion of a length of the second bus.

21. An IC device as recited in claim 20 wherein the first bus and the second bus are arranged to run parallel with one another for substantially the entire length of the second bus.

22. An IC device as recited in claim 20 wherein at least one pair of associated wires from the first plurality of pairs of associated wires is intended to transmit signals according to a static transmission scheme.

23. An IC device as recited in claim 20 wherein at least one pair of associated wires from the first plurality of pairs of associated wires is intended to transmit signals according to a dynamic transmission scheme.

24. An IC device as recited in claim 20 wherein the first isolating wire is a grounded shield wire.

25. An IC device as recited in claim 20 wherein the first isolating wire is a power wire for carrying a power signal.

* * * * *